United States Patent
Bornhofft et al.

[11] Patent Number: 6,002,253
[45] Date of Patent: Dec. 14, 1999

[54] MAGNETIC FIELD PROBE HAVING A RECTANGULAR CORE FORMED OF STRIPS OF MATERIAL

[75] Inventors: Wolfgang Bornhofft, Seevetal; Gerhard Trenkler, Barsbüttel, both of Germany

[73] Assignee: STN Atlas Elektronik GmbH, Bremen, Germany

[21] Appl. No.: 08/990,743

[22] Filed: Dec. 15, 1997

[30] Foreign Application Priority Data

Dec. 13, 1996 [DE] Germany .......................... 196 51 923

[51] Int. Cl.⁶ .................................................. G01R 33/02
[52] U.S. Cl. ............................................. 324/258; 336/234
[58] Field of Search ..................... 324/258, 256, 324/257, 260, 244, 234, 236, 239; 336/90, 219, 233, 234

[56] References Cited

U.S. PATENT DOCUMENTS

| | | | |
|---|---|---|---|
| 3,546,580 | 12/1970 | Williams | 324/258 |
| 3,657,641 | 4/1972 | Kardashian . | |
| 5,037,706 | 8/1991 | Lin et al. | 428/593 |

FOREIGN PATENT DOCUMENTS

| | | |
|---|---|---|
| 26 25 964 B2 | 12/1977 | Germany . |
| 27 01 296 B1 | 4/1978 | Germany . |
| 31 48 192 A1 | 6/1993 | Germany . |
| 59-226 882 | 5/1985 | Japan . |
| 1 597 324 | 9/1981 | United Kingdom . |

OTHER PUBLICATIONS

Magnetic and Mechanical Properties of VITROVAC@ 6025X Strip, VACUUMSCHMELZE GmbH, pp. 1–2.
Die Folie aus Polyethylenterephthalat, Hoechst Diafoil GmbH, Datenblatt Dec. 1992, pp. 3–23.

*Primary Examiner*—Walter E. Snow
*Attorney, Agent, or Firm*—Venable; George Spencer; Norman N. Kunitz

[57] ABSTRACT

A probe for the detection of alternating magnetic fields has a highly permeable probe core (10) and a measuring winding (11) surrounding the probe core, with the measuring winding being put together of several coils (111, 112, 113) which are connected in series. In order to produce a probe which is suitable for the detection of extremely low-frequency alternating magnetic fields from a minimum distance commonly required for the detection of floating bodies that emit such alternating fields, the probe core (10) is put together from flat strips (16) of amorphous or microcrystalline magnetizable material with insulating strips (17) disposed in-between. The coils of the measuring winding (11) are configured as self-supporting coils, preferably as self-bonding wire coils, and surround the probe core (10) with almost no clearance.

25 Claims, 2 Drawing Sheets ial, e.g., amor-
MAGNETIC FIELD PROBE HAVING A RECTANGULAR CORE FORMED OF STRIPS OF MATERIAL

REFERENCE TO RELATED APPLICATIONS

The application is related to applicants commonly assigned concurrently filed U.S. patent application Ser. No. (Attorney Docket ATLEK 0035), corresponding to German Patent application No. 196 51 922.5), filed Dec. 13, 1996, the subject matter of which is incorporated herein by reference.

This application claims the priority of German Patent application No. 196 51 923.3, filed Dec. 13, 1996, which is incorporated herein by reference.

BACKGROUND OF THE INVENTION

The invention relates to a probe for the detection of alternating magnetic field and having a highly permeable core and a measuring winding surrounding the core, with the measuring winding being put together of several coils connected in series.

In a known probe of this type according to German Patent No. DE 26 25 964 C3, the probe core is comprised of mumetal filaments which have a maximum diameter of 2 mm and which are encapsulated or embedded in bundles in a surrounding outer pipe. A slotted, thin-walled brass pipe serves as an outer pipe. The measuring winding is wound from copper and distributed over three coils. Each coil is wound onto a coil shell which is subdivided into three chambers to reduce the winding capacitance, each of the chambers being filled completely with the copper winding. Short distances are left clear between the individual coils, which clearances are engaged by supporting ribs for holding the probe core. The supporting ribs, in turn, are supported by a supporting plate, e.g., a U-shaped aluminum profiled section.

Probes of this type having a probe core constructed from mumetal filaments are not sensitive enough for detection purposes to also be able to detect extremely low-frequency alternating magnetic fields, which are generated in water by floating bodies, e.g., by submarines with electrical propulsion arrangements and electronic data processing systems, at a sufficiently large distance of a few hundred meters from the floating bodies. This is primarily due to the fact that the magnetic properties of the probe core that are required for this application cannot be achieved because the mumetal filaments lose their magnetic property to a great extent due to winding and unwinding and because of the mechanical alignment during the production of the probe core. This could be remedied by carrying out an annealing process after these mumetal filaments have been filled into the outer pipe. But such an annealing process destroys the enamel or lacquer insulation that is normally applied in the case of these mumetal filaments, thus creating electrical connections which increase the eddy-current influence on the probe core to such an extent that the probe no longer behaves linearly. A full annealing-capable insulation of the mumetal filaments would be possible; but this would require such a highly complex manufacturing process that the production costs for the probe are no longer acceptable.

It is the object of the invention to optimize a probe of the type mentioned at the outset for the detection of low-frequency alternating magnetic fields in water from a minimum distance commonly required for the detection of floating bodies that emit such alternating fields and to also pay attention to a simple, cost-saving manufacture.

SUMMARY OF THE INVENTION

The above object generally is achieved according to the invention, by a probe for the detection of alternating magnetic fields, comprising a highly permeable probe core and a measuring winding surrounding the probe core, with the measuring winding being formed of several coils which are connected in series; and wherein the probe core preferably has a rectangular cross section and is formed from flat strips made from amorphous or microcrystalline magnetizable material, with insulating strips disposed in-between the flat strips of magnetizable material; and the coils are configured as self-supporting coils, preferably as self-bonding wire coils, and surround the probe core with almost no clearance.

The probe according to the invention offers the advantage that the band material used for the structure of the probe core made from amorphous or crystalline material, e.g., amorphous metals sold under the trademark VITROVAC C 6025 the firm Vacuumschmelze GmbH of Hanau, Germany does not lose its magnetic properties under mechanical stress and processing, so that, in contrast to the probes with mumetal, the winding process for the production of the probe core does not impair the magnetic property of the probe core. The insulating strips inserted between the highly permeable so-called core strips prevent direct electrical contact between the core strips and the rewith suppress the formation of eddy currents within the probe core, which currents would weaken the magnetic field to be measured considerably. Since the coils of the measuring winding are configured as self-supporting coils, e. g., made by means of self-bonding technique, a coil shell can be dispensed with and the coils can be slid directly over the probe core at a minimum clearance which is only determined by tolerances. This also results in an improvement of the magnetic measuring characteristics of the probe.

The production process for the probe is simple and gives rise to the expectation of low production costs, particularly if, according to a preferred embodiment of the invention, the highly permeable probe material is placed into a core holder made from plastics or metal and having a U-shaped cross section. During the process of making the probe, two such U-shaped core holders are placed so as to adjoin one another with their yoke section, and the band material of amorphous material is wound into the two core holders in the longitudinal direction by means of a special winding device, with the insulating strip as extremely thin, strip-shaped insulating film, e. g., made from Polyethyleneterephthalate sold under the trademark Hostaphan, of Hoechst Daifoil Gmbh being arranged in-between each winding layer. In a preferred embodiment of the invention, the band material comprised of amorphous material has a thickness of approximately 20 µm and a width of approximately 5 mm, and the insulating film has a thickness of 6 µm and a width of approximately 6 mm. Instead of a single highly permeable core strip, it is also possible to parallel-wind several narrower strips of approximately 2.2 mm in width in each winding layer, with a distance remaining between them so as to avoid mutual contact. Once the U-shaped core holders are closed with an electrically conductive cover each, which is preferably bonded to the core holder, the two winding heads created during the winding process are cut open at the two core holder ends and the probe cores are saturated under vacuum with a plastic material, during which process the remaining hollow spaces are filled. Once the probe core has reached its final mechanical stability, it is given its desired length through mechanical processing or machining.

Useful embodiments of the probe according to the invention with advantageous modifications and features of the invention are disclosed.

In a preferred embodiment of the invention, the coils of the measuring winding are selected from a large production lot of coils with a view to the greatest possible matching of their winding capacitances, inductances and resonance frequencies and they are combined to form the measuring winding. This accomplishes a considerable improvement of the amplitude and phase coherence in the useful frequency range compared to the known probe in which the coils are wound in multi-chambered coil shells. The tolerance of the phase position in the useful frequency range can thus be kept to far below 2% which is accomplished, for example, with the known probe.

An advantageous embodiment of the invention provides that the U-shaped core holder filled with the core strips and the insulating strips is covered by an electrically conductive cover comprised of an Electrically conductive sheet metal piece, preferably of an insulating plate or an insulating fabric (glass fabric) having a conductor track laminated onto it. The conductor track, which is preferably comprised of copper, is provided with an electrical connection via which a voltage potential can be applied. Here, the voltage potential is dimensioned such that the capacitance that develops between the measuring winding and the probe core is minimized.

A more refined matching option for this setting of the capacitance between measuring winding and probe core results if, according to a further embodiment of the invention, the conductor tracks of the cover are subdivided into a number of conductor track sections that corresponds to the number of coils. In a copper conductor track, this is accomplished in a simple manner through etching of the copper surface. Each individual conductor track is then provided with an electrical connection. The conductor track sections are set to different voltage potentials via these electrical connections such that the resulting capacitance is minimized between probe core and measuring winding. The potential setting can also be accomplished with an integrated resistor element which is preferably comprised of SMD (surface mounted device) resistors applied between the electrical connections.

According to a further embodiment of the invention, the probe core is surrounded by an electrically conductive film which extends from the conductor track across the probe holder and back to the conductor track and which, on the one hand, is connected with the latter in an electrically conductive manner along its one end edge and, on the other hand, is electrically insulated vis-a-vis the conductor track. The electrically conductive film is also provided with an electrical connection. A voltage potential is applied across the film to reduce the electric capacitance developing between measuring winding and the probe core.

A preferred embodiment of the invention provides that, also in this case, the electrically conductive film is subdivided into a number of film sections which corresponds to the number of the coils of the measuring winding. The film sections are electrically separated from one another and are each provided with an electrical connection. Different voltage potentials are applied to the film sections via the electrical connections, with the voltage potentials being dimensioned such that the resulting capacitance between the measuring winding and the probe core turns into a minimum. The voltage potentials between the film sections can also be generated by means of an integrated resistive divider. The individual electrical connections of the film sections are connected to one another via correspondingly dimensioned resistors and are applied to a voltage potential.

According to a preferred embodiment of the invention, the probe core including measuring winding and potential surfaces is placed into a housing made from an electrically conductive material; preferably, the wall thickness of the housing is dimensioned such that the upper limiting frequency of the probe determined by the eddy current effects is between 20 Hz and z00 Hz. Because of such a housing, the influence of external interferences on the measurement result of the probe is largely suppressed. In this context it is advantageous according to a further embodiment of the invention if the adapter amplifier which is indispensable for the probe core and the current supply are also integrated into the housing, so that external interfering influences which might couple in between the probe and the amplifier also are suppressed to a great extent. Here, the amplifier must be dimensioned such that it only represents a negligibly small electrical load for the probe.

A further embodiment of the invention provides that a circumferential potential surface is placed with a clearance around the measuring winding, the potential surface being comprised of an electrically conductive sheet metal piece or an electrically conductive film, with the longitudinal end edges of the potential surface abutting against one another but being electrically insulated from one another. The potential surface is provided with electrical connections for applying a voltage potential which is set such that the capacitance developing between the measuring winding and the housing is minimized. Alternatively, the potential surface can also be connected to the electrically conductive cover of the probe core, so that the potential surface is on the same potential as the probe core.

According to a preferred embodiment of the invention, the jacket-type potential surface surrounding the measuring winding is subdivided transversely to its axis into a number of ring-shaped potential surface sections which corresponds to the number of coils. The potential surface sections are electrically separated from one another and are provided with electrical connections via which they are set to different voltage potentials. The different voltage potentials can also be brought about by an integrated voltage divider whose resistors are inserted between the electrical connections of the potential surface sections. Here, the individual voltage potentials are also dimensioned such that the resulting capacitance is minimized between the measuring winding and the housing. This is accomplished all the better, the more the electrical voltages decrease toward zero between the coils and the housing.

According to a further embodiment of the invention, a respective plane or planar potential surface is arranged between each pair of adjoining coils of the measuring winding, with each potential surface being arranged at a distance from the adjacent coils and extending at a right angle to the coil axes. The potential surface is comprised of an electrically conductive sheet metal piece or an electrically conductive film and is provided with electrical connections. With these potential surfaces, the capacitances developing between the individual coils of the measuring winding can be influenced toward minimization. For this purpose, suitable voltage potentials are applied to the electrical connections of the potential surfaces. The different potentials can either be set with a corresponding network or can be realized by means of a resistive divider whose resistors are connected between the individual connections of the potential surfaces. But the connections of the potential surfaces can also be connected with one another and be connected to a joint voltage potential.

With the targeted reduction of the capacitances that inevitably develop between the probe core and the measuring winding on the one hand, and between the measuring winding and the housing on the other and also between the coils of the measuring winding, it is accomplished that the resonance frequency of the probe is increased considerably and is thus much above the useful frequency range of the probe which is at <300 Hz when the probe is used for the task of finding the position of floating bodies emitting alternating magnetic fields. This large distance between maximum useful frequency and resonance frequency is of considerable advantage for minimizing amplitude and phase errors.

The invention is described below in greater detail by way of embodiments which are illustrated in the drawings.

DETAILED DESCRIPTION OF THE PREFERRED EMBODIMENTS

Figure 1:
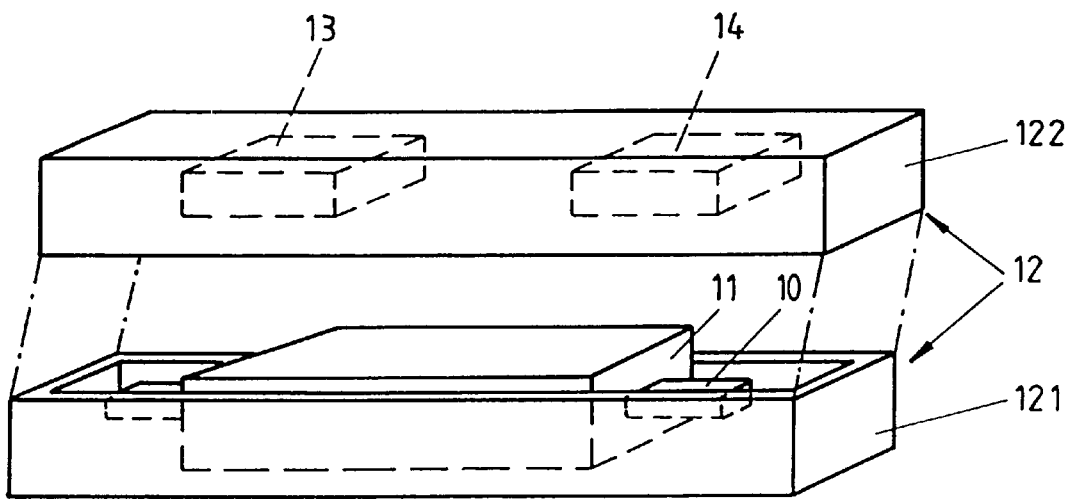
FIG. 1 is a schematic representation of a probe according to the invention for the detection of low-frequency alternating magnetic fields in water, shown in a perspective exploded view.

The probe shown schematically in a perspective exploded view in FIG. 1 for the detection of low-frequency alternating magnetic fields, such as those that are generated in water by floating bodies, e. g., submarines with electrical propulsion arrangements and electronic data processing systems, has a highly permeable probe core 10, a measuring winding 11 which is pushed over the probe core 10 and a housing 12 accommodating the probe core 10 including the measuring winding 11. The housing 12 has two parts and is comprised of a bottom shell 121 and a top shell 122 which rest on top of one another with a circumferential front face and are bonded to one another so as to be watertight. Also integrated into the housing 12 are an adapter or matching amplifier 13, preferably as disclosed in the applicants' above identified concurrently filed U.S. patent application Ser. No., and a current supply 14 for operating the probe. The matching amplifier 13 is dimensioned such that it only represents a negligibly small electrical load for the probe. The housing 12 is comprised of an electrically conductive material, and the thickness of the housing wall is dimensioned such that the upper limiting frequency of the probe, which is determined by eddy current effects, is between 20 Hz and 100 Hz.

Figure 2:
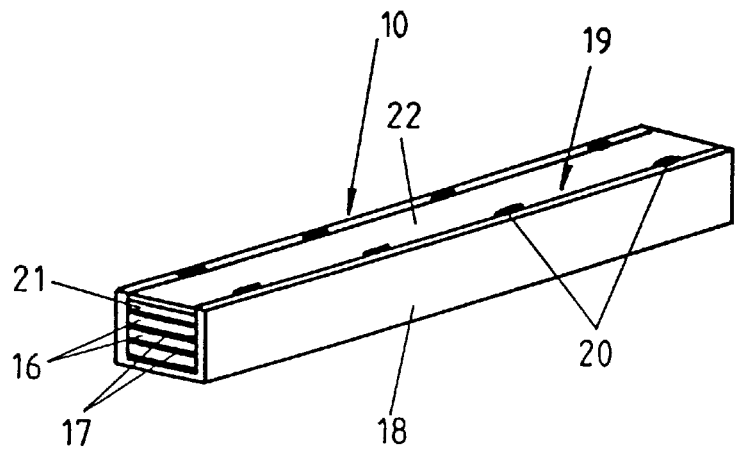
FIG. 2 is a perspective illustration of an embodiment of a probe core according to the invention of the probe of FIG. 1.

The highly permeable probe core 10 is illustrated in a perspective view in FIG. 2. The core 10 is composed of a plurality of flat strips made from an amorphous or microcrystalline magnetizable material, identified below as core strips 16, with insulating strips 17 arranged in-between. VITROVAC 6025 of the firm Vacuumschmelze Hanau, for example, is used as the material for the strips 16. The insulating strips 17 are cut to size from an extremely thin insulating film, e.g., made from Hostaphan, such that they cover the core strips 16 with overhang. In a preferred embodiment, the core strips 16 have a thickness of 20 $\mu$m and a width of approximately 5 mm and the insulating strips 17 have a thickness of 6 $\mu$m and a width of 6 mm. Instead of a single wide core strip 16, each layer may also have several narrower individual strips, e. g., having a width of 2.2 mm, disposed parallel next to one another, with a clearance remaining between them so that they do not touch. If the effective permeability of the probe core 10 is to be set in a targeted manner, material with different permeability is used for the superposed core strips 16 which are separated by one insulating strip 17 each. The narrow individual strips can also be provided with different permeability in each layer. The insulating strips 17 having a width of 6 mm are cut to be slightly wider than the core strips 16. Thus the insulating strips 17 ensure that a direct electrical contact between the individual highly permeable core strips 16 is also reliably prevented along the edges.

For the production of the probe core 10, a special winding arrangement is used which winds or wraps the core strips 16 available as band material along with the insulating strips 17, also available as band material, disposed in-between into a core holder 18 having a U-shaped, rectangular or square cross section. After the core holder 18 is filled with the strips 16 and 17, open upper end of the U shaped core holder 18 is closed with an electrically conductive cap 19 which is bonded to the core holder 18. The adhesive points between the cap 19 and side walls of the holder 18 are indicated by reference numeral 20 in FIG. 2. The electrically conductive cover 19 is preferably composed of a base plate 25, which may be an epoxy printed circuit card, onto which a conductor track 22, preferably a copper conductor track, is laminated (see FIG. 3 and FIG. 5). The probe core 10 designed in this manner is impregnated with a synthetic resin under vacuum, with the remaining hollow spaces being filled and, subsequently, the probe core is given its desired length through mechanical processing or machining.

Figure 6:
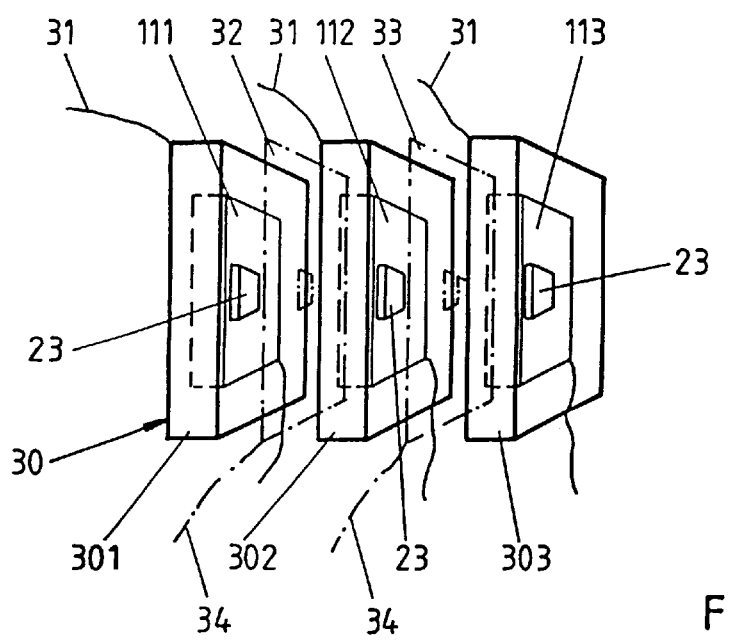
FIG. 6 is a perspective illustration of the measuring winding of the probe of FIG. 1 with ring-shaped potential surface sections and plane potential surfaces according to a feature of the invention.

The measuring winding 11 is comprised of several individual coils, here three coils 111, 112 and 113, (see FIG. 6), which are each designed as self-supporting coils, e. g., made from self-bonding wire, and are electrically connected in series (FIG. 6). The coils 111, 112 and 113 each have a rectangular cross section and are directly pushed over the probe core 10 while maintaining a mutual distance between the coils. The coils 111–113 are wound such that they surround the probe core 10 largely without a clearance. The center clear opening of the coils 111 to 113 for the sliding through of the probe core 10 is indicated by reference numeral 23 in FIG. 6. Depending on the configuration of the probe core, the opening 23 in each coil has a square or rectangular cross section. The coils 111 to 113 of the measuring winding 11 preferably are selected from a larger production lot of individual coils with respect to the matching of at least one of their quantities, winding capacitance, inductance and resonance frequency. Preferably, those coils 111 to 113 are combined to form the measuring winding 11 which portray the greatest matching of all three quantities.

Figure 3:
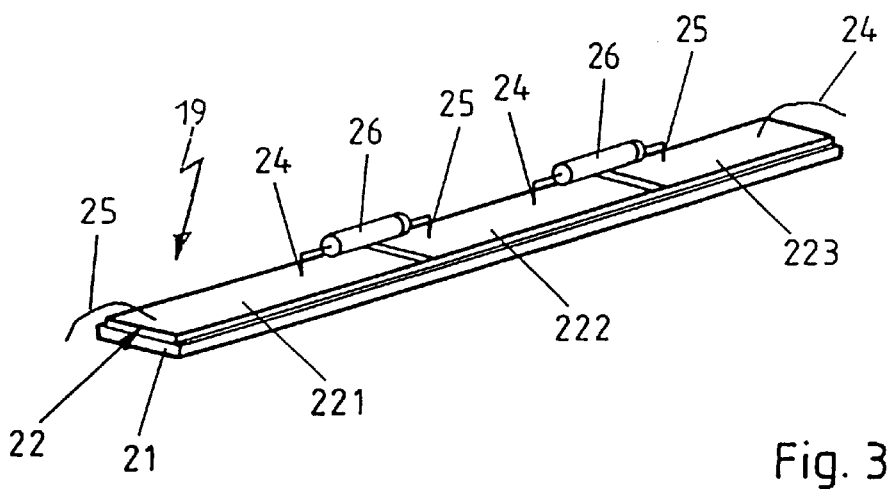
FIG. 3 is a perspective illustration of a cover of the probe core of FIG. 2.

Corresponding to the division of the measuring winding 11 in a direction transverse to the longitudinal direction of the cover into three self-supporting coils 111 to 113, the conductor track 22 on the base plate 21 of the cover 19 is subdivided into three conductor track sections 221, 222 and 223, arranged one behind the other in the longitudinal direction of the cover or core. The subdivision might be done, for example, by means of etching of the copper layer. Each conductor track section 221 to 223 can be connected externally via respective connecting lines 24, 25 so as to reduce, and preferably eliminate, the influence of the capacitances developing between one probe core 10 and the measuring winding 11 by controlling the electrical potential of the conductor track sections 221 to 223. In the embodiment of FIG. 3, the different voltage potentials at the conductor track sections 221 to 223 are realized by a resistive voltage divider made from SMD resistors 26 which are inserted between the electrical connections 24 and 25 of the adjoining conductor track sections 221 to 223. The two outer electrical connections 24 and 25 of the two outer conductor track sections 221 and 223 are applied to an external voltage potential.

Figure 5:
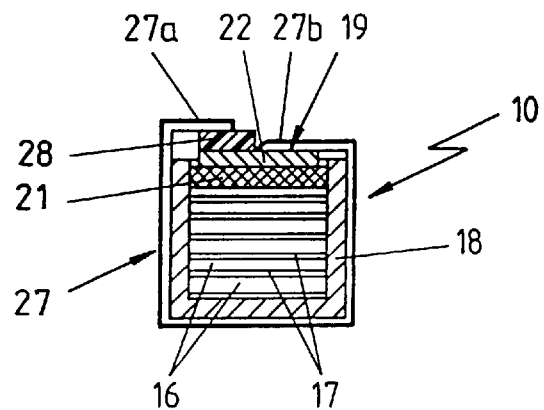
FIG. 5 is a cross-section of the probe core according to the invention along the cutting surface V—V of FIG. 4.

An improved reduction of the capacitance developing between the measuring winding 11 and the probe core 10 can be accomplished if the probe core 10 is surrounded by an electrically conductive film 27, as is shown in FIG. 5. The film 27 extends starting from the conductor track 22 of the cover 19 around the entire periphery of the core holder 18 back to the conductor track 22. To prevent the film from forming a closed current path, one longitudinally extending end section 27a of the film 27 is insulated vis-a-vis the conductor track 22 by means of an interposed insulating strip 28. When dispensing with the insulating strip 28, the same effect can be accomplished in that the conductor track 22 is slotted, longitudinally, i.e., in the longitudinal direction, to form two longitudinally extending portions. Thus, with this arrangement, the two longitudinally extending end sections 27a, 27b of the film 27 can be connected with the slotted conductor track 22 on both sides of the longitudinal slot so as to be electrically conductive, e. g., by means of soldering. When the insulating strip 28 is used vis-a-vis the conductor track 22 without a longitudinal slot, only the longitudinal end section 27b of the film 27 is soldered to the conductor track 22 in a conductive manner.

Figure 4:
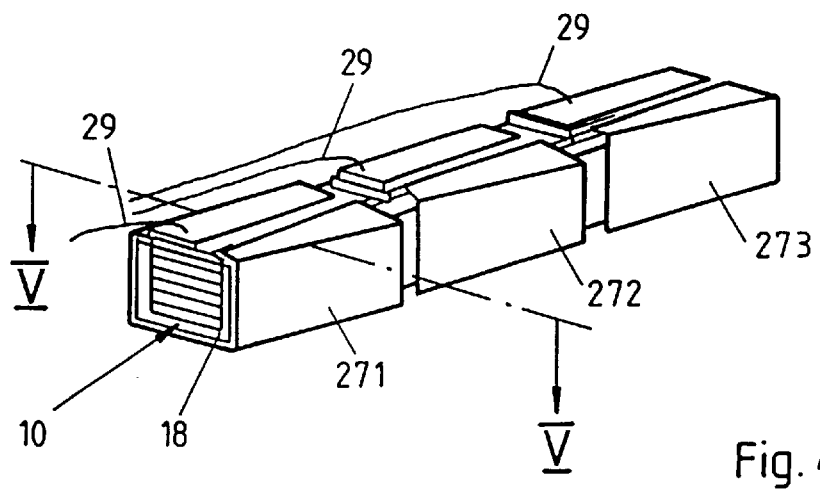
FIG. 4 is perspective illustration of the probe core of FIG. 2 surrounded by a potential surface.

Corresponding to the division of the measuring winding 11 into three coils 111 to 113, it is advisable to subdivide the electrically conductive film 27 into three individual film sections 271, 272 and 273 that are spaced apart from one another, as is illustrated in FIG. 4. Each film section 271 to 273 is provided with an electrical connection 29. Different electrical potentials can then be applied to the film sections 271 to 273 via the connections 29. Here, the electrical potential of the individual film sections 271 to 273 is dimensioned such that the resulting capacitance between probe core 10 and measuring winding 11 becomes minimal. In turn, these differences in potential can again be brought about by means of an integrated resistive divider, as was described with respect to FIG. 3.

As is illustrated schematically in FIG. 6, a potential surface 30 is placed around the measuring winding 11 at a clearance from the same in a circumferential, jacket-like manner. The potential surface 30 is made from an electrically conductive sheet metal piece or from an electrically conductive film, and preferably is divided into three ring-shaped potential surface sections 301, 302 and 303 corresponding to the subdivision of the measuring winding 11, with a potential surface section 301 or 302 or 303 surrounding a coil 111 or 112 or 113, respectively, with a clearance. In order to prevent a closed current path within the potential surface sections 301 to 303, at least the ends of the respective potential surface sections 301 to 303, which face or abut one another when the ring is formed and which extend in the axial direction, are insulated electrically with respect to one another. This may be accomplished through a slotting of the potential surface sections parallel to the axis of the measuring winding 11. Each potential surface section 301 to 303 is provided with a respective electrical connection 31. These potential surface sections 301 to 303 are intended to reduce the influence of the capacitances to a large extent which develop between the measuring winding 11 and the housing 12. For this purpose, suitable electrical potentials are again applied to the potential surface sections 301 to 303 via the electrical connections 31. The potential can be controlled via an integrated network or an integrated resistive divider, as is illustrated in FIG. 3. It is also possible to connect all potential surface sections 301 to 303 with one another and to connect them to an electrical potential. But in this case, a subdivision of the potential surface 30 into the potential surface sections 301 to 303 can also be dispensed with, so that the potential surface 30 surrounds the measuring winding 11 over its full length.

Since capacitances that have a negative influence on the magnetic properties of the probe also develop between the individual coils 111 to 113, a respective plane or planar potential surface 32 or 33 is arranged between each pair of adjoining coils 111 and 112 or 112 and 113, which potential surface 32 or 33 is at a distance from the adjacent coils and extends at a right angle to the coil axes, as illustrated in dash-dot lines in FIG. 6. Each potential surface 32 or 33 is comprised of an electrically conductive sheet metal piece or an electrically conductive film and is provided with an electrical connection 34. In turn, electrical voltage potentials are applied to these potential surfaces 32, 33, namely in a magnitude such that the capacitances developing between the coils 111 to 113 are minimal. The required voltage potentials are applied to the potential surfaces 32, 33 by way of integrated networks via the connections 34. It is also possible to use an integrated resistive divider. But the potential surfaces can also be connected to one another and be applied to a common control potential.

The invention now being fully described, it will be apparent to one of ordinary skill in the art that any changes and modifications can be made thereto without departing from the spirit or scope of the invention as set forth herein.

What is claimed:

1. A probe for the detection of alternating magnetic fields, comprising: a highly permeable probe core and a measuring winding surrounding the probe core, with the measuring winding being put together of several coils which are connected in series; and wherein: the probe core has a rectangular cross section and is formed from flat strips made from amorphous or microcrystalline magnetizable material with insulating strips disposed in-between the flat strips of magnetizable material; the coils are configured as self-supporting coils, and surround the probe core with almost no clearance; the insulating strips are cut from an extremely thin insulating film, such that they cover the core strips with overhang at the edges; the core strips and the insulating strips are disposed as alternating layers in a core holder having a U-shaped, rectangular cross section; the core holder is closed with an electrically conductive cover; and the coils are directly pushed over the core holder closed with the cover.

2. A probe according to claim 1, wherein the coils are self-bonding wire coils.

3. A probe according to claim 1, wherein the respective core strips of the probe core are provided with different permeabilities.

4. A probe according to claim 1, wherein each core strip is subdivided into several narrow individual strips which are separated longitudinally from one another and are spaced apart, with the individual strips being provided with identical or different permeabilities.

5. A probe according to claim 1, wherein the electrically conductive cover is comprised of an insulating plate, or an insulating fabric, having a conductor track laminated onto its upper surface side, and the conductor track is provided with electrical connections.

6. A probe according to claim 5, wherein the core holder containing the core strips and the insulating strips and closed with the cover, is filled under vacuum with a plastic material.

7. A probe according to claim 5, wherein the probe core is surrounded by an electrically conductive film which extends from the conductor track of the cover around the core holder and back to the conductor track and which is connected with the conductor track in electrically conductive manner along its one longitudinally extending end section and, is electrically insulated vis-a-vis the conductor track with its other longitudinally extending end section; and the electrically conductive film is provided with electrical connections.

8. A probe according to claim 7, wherein the electrical insulation between the other longitudinally extending end section and the film of the conductor track is effected by one of an insulating strip arranged between the conductor track and said other longitudinally extending end section of the film, and a longitudinal slotting of the electrical conductor track.

9. A probe according to claim 7, wherein the conductor track is subdivided in a direction transverse to the longitudinal direction of the core holder into a number of conductor track sections which corresponds to the number of coils of the measuring winding, with the respective conductor track sections each having electrical connections and being electrically separated from one another; the electrically conductive film surrounding the probe core is subdivided into a number of film sections which corresponds to the number of the coils of the measuring winding, which film sections are electrically separated from one another and are each provided with electrical connections; and different voltage potentials are applied to the conductor track sections and to the film sections via the electrical connections.

10. A probe according to one of claim 9, wherein the voltage potentials applied to the individual conductor track sections and film sections are dimensioned such that the resulting capacitance between the probe core and the measuring winding is minimized.

11. A probe according to claim 5, wherein the conductor track is subdivided in a direction transverse to the longitudinal direction of the core holder into a number of conductor track sections which corresponds to the number of coils of the measuring winding, with the respective conductor track sections each having electrical connections and being electrically separated from one another; and different voltage potentials are applied to the conductor track sections via the electrical connections.

12. A probe according to claim 11, wherein the voltage potentials applied to the individual conductor track sections are dimensioned such that the resulting capacitance between the probe core and the measuring winding is minimized.

13. A probe according to claim 1, wherein the coils of the measuring winding are selected from a larger production lot of coils with a view to the greatest possible matching of at least one of their quantities: winding capacitance, inductance and resonance frequency, and are combined to form the measuring winding.

14. A probe according to claim 5, further comprising a housing made from an electrically conductive material which accommodates the probe core including the measuring winding.

15. A probe according to claim 14, further comprising: a circumferential potential surface disposed with a clearance around the circumference if the measuring winding, with this potential surface being comprised of one of an electrically conductive sheet metal piece and an electrically conductive film, and being interrupted by at least one axial insulating rib; and electrical connections are provided on the potential surface for applying voltage potentials.

16. A probe according to claim 15, wherein the axially extending insulating rib in the circumferential potential surface is a slot extending parallel to the winding axis of the measuring winding.

17. A probe according to claim 15, wherein the potential surface is subdivided into a number of ring-shaped potential surface sections which corresponds to the number of coils of the measuring winding, with the potential surface sections being electrically separated from one another and provided with respective electrical connections.

18. A probe according to claim 17, wherein the potential surface sections are electrically connected with the associated conductor track sections of the probe core.

19. A probe according to claim 17, wherein the voltage potentials applied to the ring-shaped potential surface sections are dimensioned such that the resulting capacitance between probe core and housing is minimized.

20. A probe according to claim 5, wherein the coils of the measuring winding are disposed next to one another in the axial direction of the probe core almost without a clearance.

21. A probe according to claim 20, further comprising a respective plane potential surface extending at a right angle to the coil axes arranged between each pair of adjacent coils of the measuring winding, with each potential surface being comprised of one of an electrically conductive sheet metal piece and an electrically conductive film, and being provided with electrical connections.

22. A probe according to claim 21, wherein, the plane potential surfaces lie at the same electrical potential as the conductor track of the probe core.

23. A probe according to claim 22, wherein the voltage potentials present at the plane potential surfaces are dimensioned such that the resulting capacitance between the coils is minimized.

24. A probe according to claim 9, wherein the different voltage potentials are produced by a voltage divider of SMD resistors connected between the electrical connections of adjacent conductor track sections.

25. A probe according to claim 14, wherein a matching amplifier connected to the measuring winding and a current supply source additionally are integrated in the housing.

* * * * *